United States Patent
Dobbs et al.

(10) Patent No.: US 6,680,853 B1
(45) Date of Patent: Jan. 20, 2004

(54) SYSTEMS AND METHODS FOR MOUNTING COMPONENTS TO CIRCUIT ASSEMBLIES

(75) Inventors: Robert William Dobbs, Granite Bay, CA (US); James Kristian Koch, Rocklin, CA (US); Andrew Harvey Barr, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/351,950

(22) Filed: Jan. 27, 2003

(51) Int. Cl.⁷ .................................................. H05K 7/02
(52) U.S. Cl. .................... 361/810; 361/818; 361/717
(58) Field of Search .................................. 361/810, 825, 361/816, 818, 785, 748, 752, 760, 764, 709, 717, 800–802; 257/704; 174/35 R

(56) References Cited

U.S. PATENT DOCUMENTS

| | | | | |
|---|---|---|---|---|
| 4,739,452 A | * | 4/1988 | Fukunaga | 361/756 |
| 5,155,661 A | * | 10/1992 | Nagesh et al. | 361/715 |
| 5,182,632 A | * | 1/1993 | Bechtel et al. | 257/713 |
| 5,379,185 A | * | 1/1995 | Griffin et al. | 361/709 |
| 5,673,182 A | | 9/1997 | Garner | |
| 5,870,284 A | | 2/1999 | Stewart et al. | |
| 6,180,874 B1 | | 1/2001 | Brezina et al. | |
| 6,208,526 B1 | * | 3/2001 | Griffin et al. | 361/785 |
| 6,362,968 B1 | | 3/2002 | Lajara et al. | |
| 6,408,505 B1 | | 6/2002 | Hata et al. | |
| 6,417,027 B1 | | 7/2002 | Akram | |
| 6,435,808 B1 | | 8/2002 | Araya et al. | |

* cited by examiner

Primary Examiner—David Martin
Assistant Examiner—Thanh S. Phan

(57) ABSTRACT

Systems for mounting components to circuit assemblies are provided. One such system comprises a circuit assembly having a front, a back, a length and a width. A support structure is attached to one of the front and the back of the circuit assembly, with the support structure being sized and shaped to span at least one of the length and the width of the circuit assembly. A first component is attached to the support structure such that at least a portion of the support structure is located between the first component and the circuit assembly, with the first component electrically communicating with the circuit assembly. Methods and other systems also are provided.

14 Claims, 4 Drawing Sheets

SYSTEMS AND METHODS FOR MOUNTING COMPONENTS TO CIRCUIT ASSEMBLIES

BACKGROUND

In electrical systems, it is oftentimes necessary to attach one or more components to a printed circuit board (PCB). As is known, various techniques have been used for attaching such components to PCBs. By way of example, solder and pressure contacts have been used. Although meeting with various degrees of success, each of these techniques imposes corresponding requirements upon the PCB to which the components are to be attached.

With respect to the use of solder, a PCB should be substantially rigid so that the PCB is not able to bend or flex excessively. Such a rigid PCB ensures that the solder joints do not crack due to bending of the PCB. With respect to the use of pressure contacts, a PCB should be substantially flat so that clamping forces can be properly applied to attach a component to the PCB via the pressure contacts.

In some applications, multiple attachment techniques are used on a single PCB. For instance, solder can be used to attach one component to a PCB, while pressure contacts are used to attach another component to the PCB. The use of multiple attachment techniques on a single PCB, however, can place increased requirements on the PCB. In the above-mentioned example in which solder and pressure contacts are used, additional structure typically is added to the PCB to provide appropriate degrees of rigidity and flatness. Unfortunately, the PCB, the attached components and additional structure form a discontinuous mechanical assembly that can impart undue mechanical stresses on the PCB, e.g., stresses caused by disparate thermal expansion of various portions of the mechanical assembly. Additionally, bending moments can be concentrated between non-continuous portions of the assembly, which can cause PCB trace damage.

SUMMARY

Systems and methods for mounting components to circuit assemblies are disclosed herein. An embodiment of such a system includes a circuit assembly, a support structure and a first component. The circuit assembly has a front, a back, a length and a width. The support structure is attached to one of the front and the back circuit assembly, with the support structure being sized and shaped to span at least one of the length and the width of the circuit assembly. The first component is attached to the support structure such that at least a portion of the support structure is located between the first component and the circuit assembly, with the first component electrically communicating with the circuit assembly.

An embodiment of a method for mounting a component to a circuit assembly comprises: providing a circuit assembly; providing a support structure of unitary construction; and attaching the support structure to the circuit assembly such that the support structure substantially spans at least one of the length and the width of the circuit assembly.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

DETAILED DESCRIPTION

As will be described in detail here, support structures and associated methods enable components to be attached to circuit assemblies. In some embodiments, the support structures fulfill multiple functional requirements, such as increasing rigidity of, ensuring flatness of, providing EMI containment for and/or mounting components to a circuit assembly.

Figure 1:
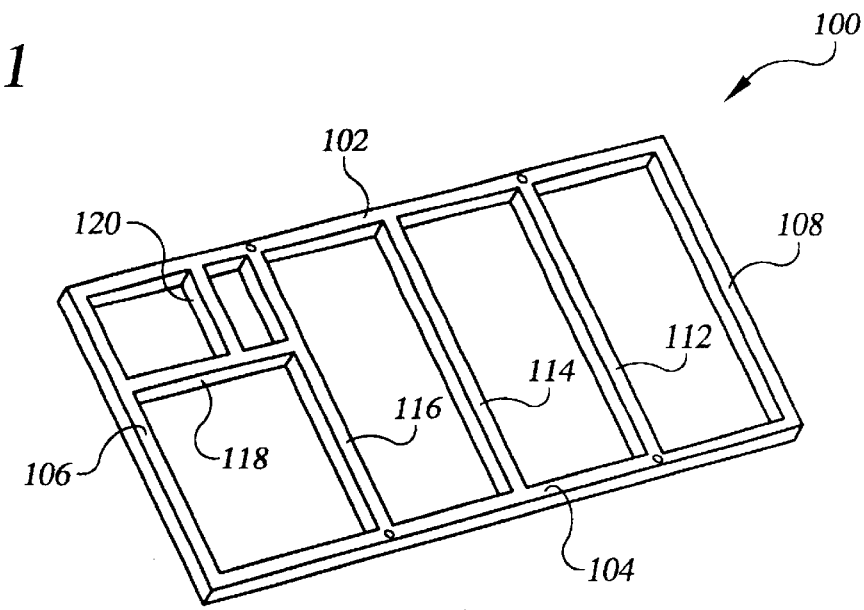
FIG. 1 is a perspective view of an embodiment of a circuit assembly support structure.

As shown in FIG. 1, an embodiment of a support structure 100 includes opposing rails that define a periphery of the support structure. Specifically, support structure 100 of FIG. 1 includes opposing rails 102 and 104, as well as opposing rails 106 and 108, which are generally perpendicular to the rails 102 and 104. Support structure 100 also includes beams 112, 114, 116, 118 and 120. Beams 112, 114 and 116 are generally parallel to each other, as well as to the opposing rails 106 and 108. Each of the beams 112, 114 and 116 extends between opposing rails 102 and 104. In contrast, beams 118 and 120 each attach to at least one other beam. Specifically, beam 118 extends between beam 116 and rail 106, and beam 120 extends between beam 118 and rail 102.

In a typical implementation, the rails 102, 104, 106 and/or 108 are attached to a circuit assembly. Specifically, beams 112, 114, 116, 118 and 120 distribute weight and stress about and ensure localized rigidity of the circuit assembly to which the support structure 100 is attached. Note, one or more of the beams also can be attached to the circuit assembly.

Various materials can be used to form the rails and/or beams of a support structure. For example, metals such as aluminum and copper, metal alloys and non-metals such as plastics, ceramics and fiberglass can be used. In some embodiments, the materials can be coated to avoid corrosion, for example.

Figure 2:
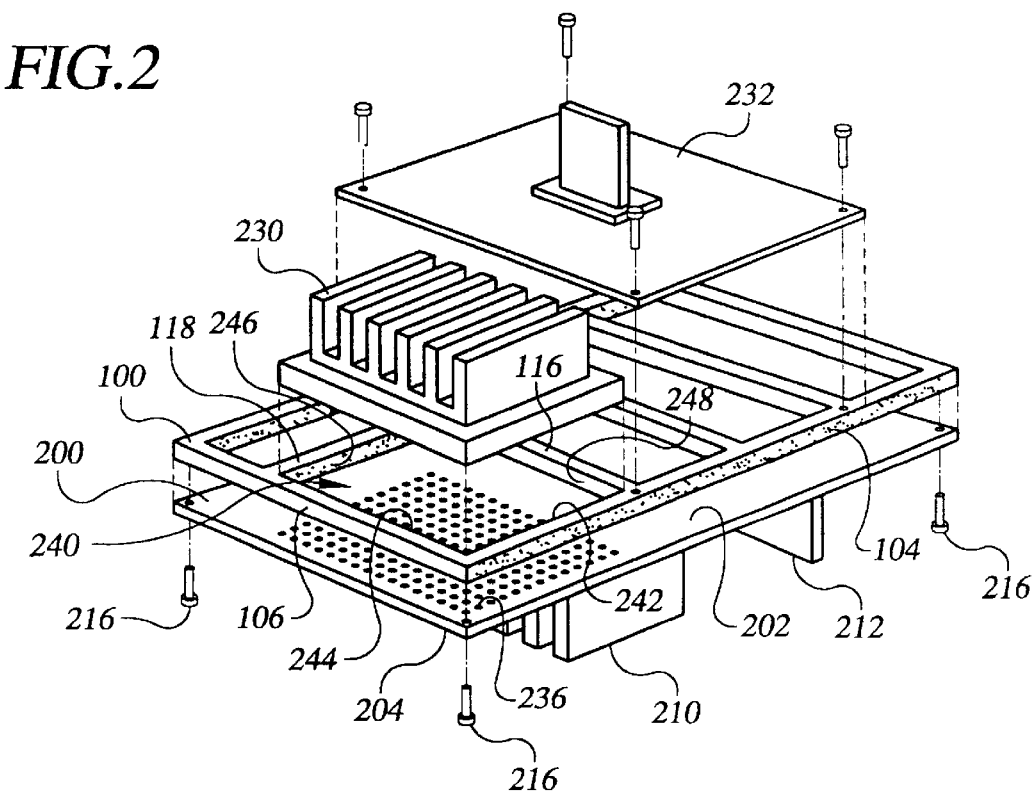
FIG. 2 is a partially-exploded, perspective view of the support structure of FIG. 1, showing components being attached to the support structure.

In FIG. 2, support structure 100 of FIG. 1 is used to mount components to a printed circuit assembly (PCA) 200. PCA 200 has a front 202 and a back 204. The back 204 of the PCA 200 mounts components 210 and 212, with the front 202 of the PCA being attached to a bottom surface 214 of the support structure 100. Mechanical fasteners (e.g., pins) 216 are used to attach the PCA 200 to the support structure 100. In other embodiments, however, various other techniques can be used to attach a PCA to a support structure. For instance, adhesives and/or other mechanical fasteners, such as screws, rivets, slides, latches, interlocking structures and/or clamshells located on both sides of the PCA, can be used.

Electrical components 230 and 232 also are depicted in FIG. 2. Specifically, electrical component 230, which is an application specific integrated circuit (ASIC) and associated heat sink, is to be attached to the front 202 of the PCA by soldering the component 230 to the land pattern 236 of the PCA 200. Note, other attachment methods, such as solder column, Ball Grid Array (BGA), though-hole and/or surface mount (SMT), for example, could be used.

Support structure 100 facilitates mounting of component 230 to the PCA 200 in several ways. In particular, support structure 100 provides increased structural rigidity to the PCA 200 so that the solder used to attached component 230 resists cracking. Additionally, rails 104, 106 and beams 116, 118 define a zone 240 of the PCA 200 within which component 230 is to be mounted. This enables the inner surfaces 242, 244, 246 and 248 of the respective rails 104, 106 and beams 116, 118 to be used as guides for aligning the component 232 with respect to the PCA 200. Note that inclined and/or notched guide surfaces can be used for alignment and/or retention for either or both of pre-solder and post-solder processes, such as servicing and rework.

With respect to the component 232 (a mezzanine board), the support structure 100 tends to maintain overall flatness of the PCA 200 so that clamping forces can be properly applied for mating a connector (not shown) of the PCA 200 with a connector (not shown) of the component 232. This tends to reduce component fracture, which can occur when a pin or contact bends during insertion into or extraction from a connector that is not properly positioned. Note, typical insertion forces can approach 100 lbs., which can cause a connector to bend.

In FIG. 2, component 232 is mounted directly to the support structure 100. Since the support structure 100 is located between component 232 and PCA 200, the thickness of the rails and beams of the support structure 200 are appropriately selected to enable the component 232 to electrically communicate with the PCA 200.

By using a support structure of unitary construction, multiple components can be place closer together on a circuit assembly than would otherwise typically be accommodated by using individual mounting techniques for each component. In the case of mounting ASICs adjacent to each other, this can reduce critical bus length between the ASICs, which potentially increases the quality and/or speed of busses. Additionally, by potentially enabling components to be placed closer together, the overall size of a circuit assembly can be reduced which can reduce manufacturing costs. Unitary construction of a support structure also results in fewer parts, and corresponding reductions in inventories, as well as potential reductions in assembly and support labor costs associated with assembling the components and circuit assemblies. The support structure also can provide extra grounding paths, EMI containment and thermal conduction paths and, thus, can be advantageous from a PCA design perspective.

Figure 3:
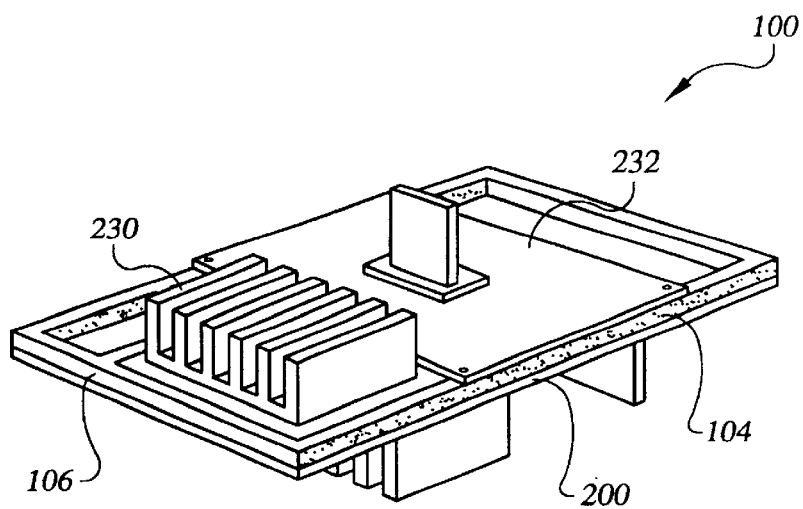
FIG. 3 is a perspective view of the support structure of FIG. 1, showing the components attached to the support structure.

FIG. 3 depicts components 230 and 232 mounted to support structure 100. As shown in FIG. 3, a portion of component 232 contacts rail 104 and, thus, the thickness of rail 104 determines the spacing of component 232 from the circuit assembly 200. Also note that the support structure 100 is substantially coextensive with an outer periphery of the circuit assembly 200. In other embodiments, several examples of which will be shown and described later, the support structure may substantially span at least one of the length and width of the circuit assembly.

Figure 4:
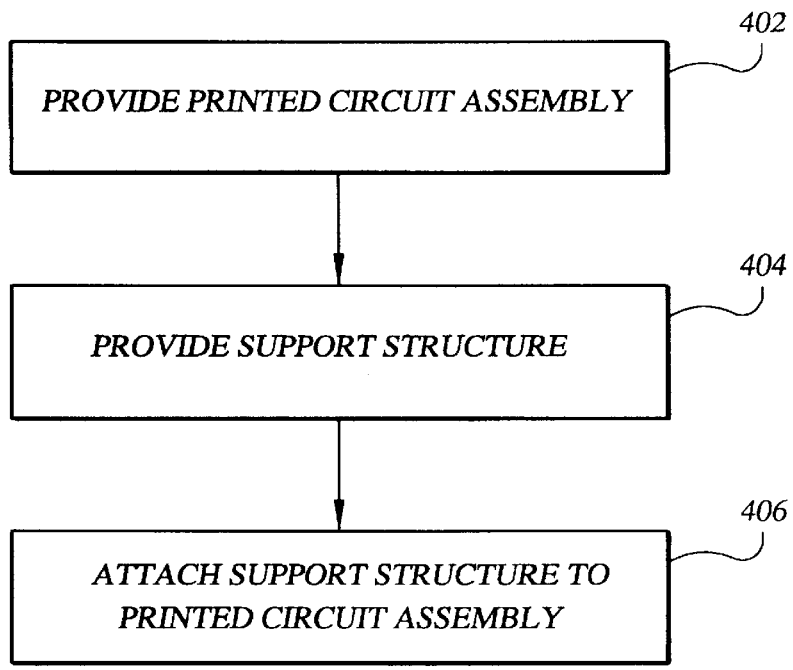
FIG. 4 is an embodiment of a method for mounting a component to a circuit assembly.

An embodiment of a method for mounting components to a circuit assembly is depicted in the flowchart of FIG. 4. As shown in FIG. 4, the method may be construed as beginning at block 402 where a printed circuit assembly is provided. In block 404, a support structure is provided. Thereafter, the support structure is attached to the printed circuit assembly (block 406).

Figure 5:
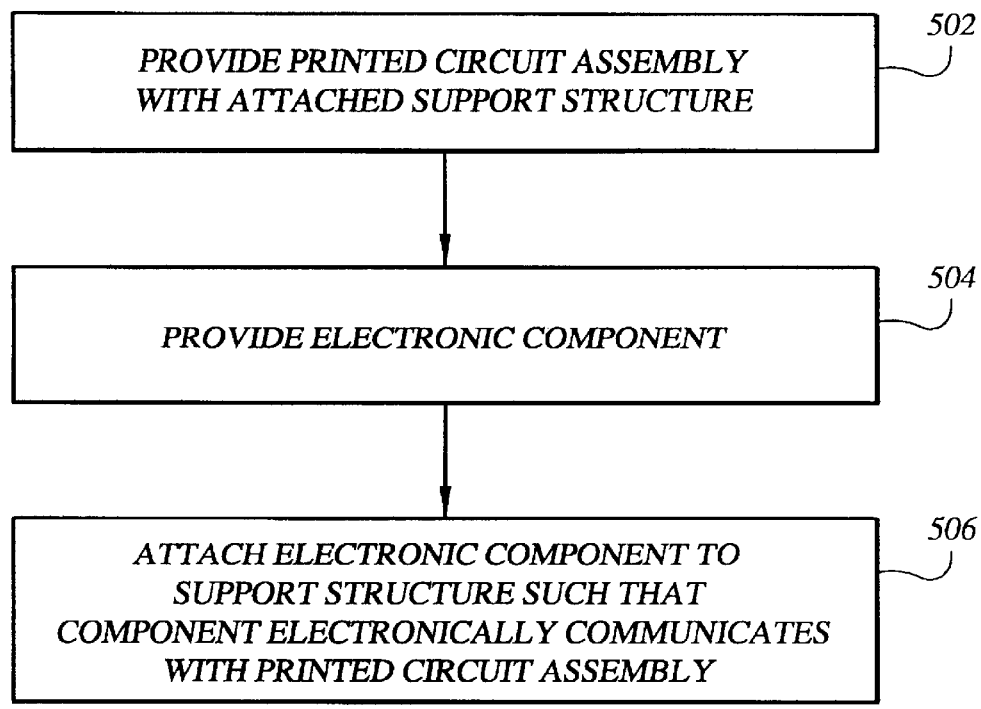
FIG. 5 is another embodiment of a method for mounting a component to a circuit assembly.

Another embodiment of a method is depicted in the flowchart of FIG. 5. As shown in FIG. 5, the method may be construed as beginning at block 502, where a printed circuit assembly with an attached support structure is provided. In block 504, an electrical component is provided. Thereafter, the electrical component is attached to the support structure so that the component electrically communicates with the printed circuit assembly (block 506). Note, in some embodiments, the component is thermally coupled to the support structure so that the support structure functions as a heat sink. In such an application, among others, the coefficients of thermal expansion of the various materials used in the overall assembly, i.e., the support structure, circuit assembly and attached component(s), should be considered over the non-operating and operating temperature ranges of the assembly. This can ensure that tolerances for good electrical contacts and physical attachments are maintained. Typically, however, the support structure should remain electrically isolated from signals and voltage rails.

Figure 6:
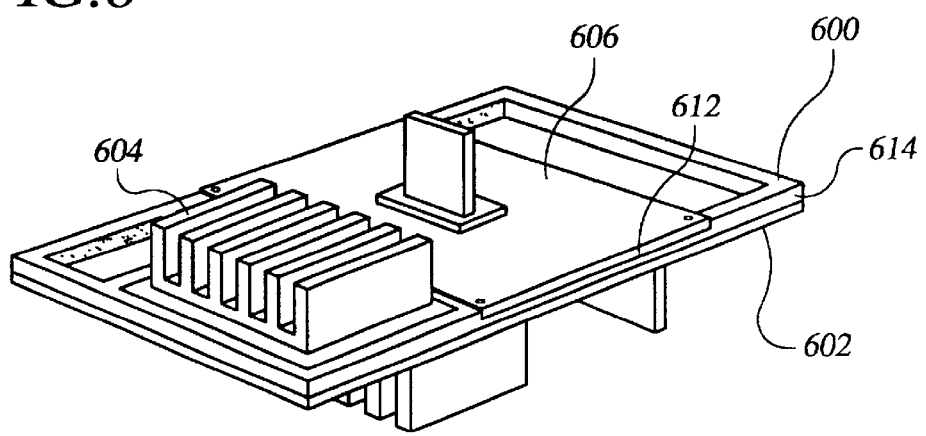
FIG. 6 is a perspective view of another embodiment of a support structure to which a printed circuit assembly and multiple electrical components are attached.

Another embodiment of a support structure is depicted in FIG. 6. In FIG. 6, support structure 600 is attached to a PCA 602 and is used to attach components 604 and 606 to the PCA. A recessed portion 612 is formed in a rail 614 of the support structure. Recess 612 serves as an alignment feature that can be used to position component 606.

Figure 7:
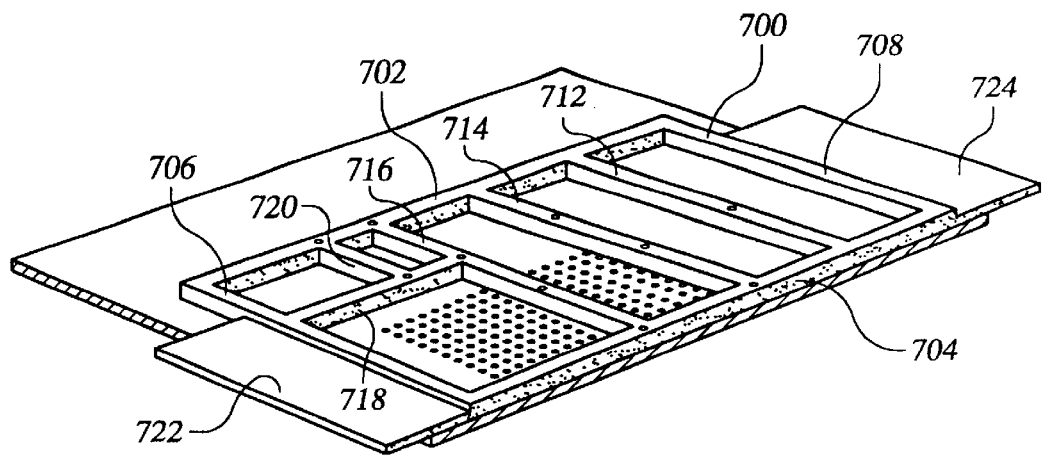
FIG. 7 is another embodiment of a support structure shown attached to a printed circuit assembly.

Another embodiment of a support structure is depicted in FIG. 7. As shown in FIG. 7, support structure 700 includes rails 702, 704, 706 and 708, which define a periphery of the support structure. Beams 712, 714, 716, 718 and 720 span across various portions of the interior of the structure. Clearly, various numbers and locations of attachment of beams can be used.

Additionally, support structure 700 includes flanges 722 and 724, with flange 722 extending outwardly from rail 706 and flange 724 extending outwardly from rail 708. By way of example, these flanges can be grasped by a user for facilitating insertion and/or removal of the support structure and associated circuit assembly. Note, support structure 700 is longer than the circuit assembly and, thus, extends beyond the edges of the circuit assembly with respect to length, while being narrower than the circuit assembly.

Figure 8:
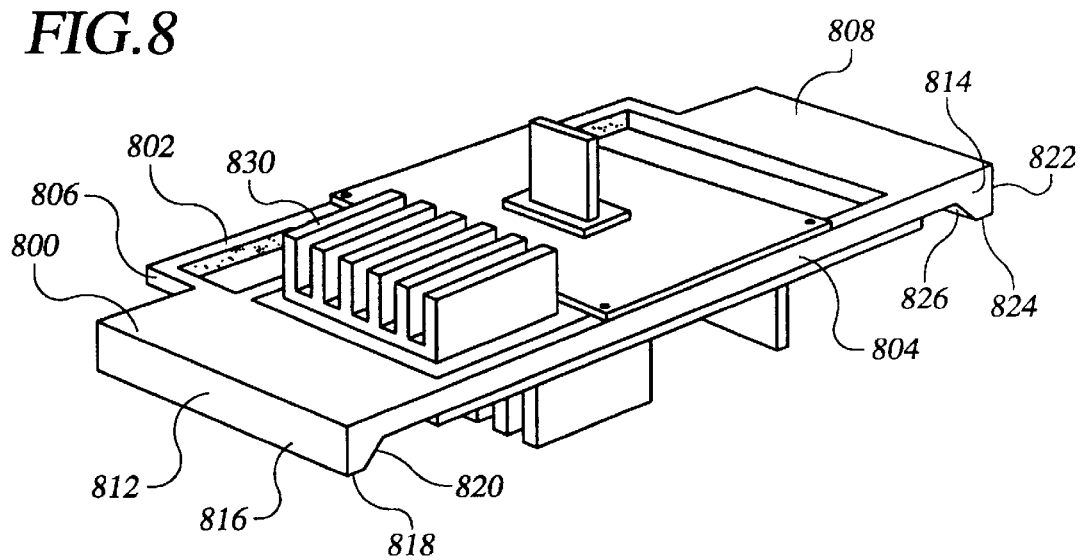
FIG. 8 is a perspective view of another embodiment of a support structure to which a printed circuit assembly and multiple electrical components are attached.

Another embodiment of a support structure is depicted in FIG. 8. As shown in FIG. 8, support structure 800 includes rails 802, 804, 806 and 808. Flanges 812 and 814 extend from rails 806 and 808, respectively. Specifically, flange 812 includes a downwardly directed surface 816, a bottom 818, and an inwardly inclined surface 820 and flange 814 includes a downwardly directed surface 822, a bottom 824 and an inwardly inclined surface 826.

In contrast to flanges 722 and 724 of FIG. 7, flanges 812 and 814 extend outwardly and downwardly from their respective rails. Thus, at least a portion of each flange resides outside the plane in which the rails are located. This particular configuration enables the support structure to function as a pedestal that elevates the attached components, e.g., component 830, with respect to the device (not shown) to which the support structure 800 is mounted.

It should be emphasized that many variations and modifications may be made to the above-described embodiments. By way of example, although single support structures are depicted herein as being individually attached to corresponding PCBs, multiple support structures could be attached to a single PCB. That is, a first support structure can be attached to the front of a PCB, while a second support structure is attached to the back of the PCB. All such modifications and variations are intended to be included herein within the scope of this disclosure and protected by the following claims.

What is claimed is:

1. A system comprising:
    a circuit assembly having a front, a back, a length and a width;
    a support structure attached to one of the front and the back of the circuit assembly, the support structure being sized and shaped to span at least one of the length and the width of the circuit assembly;
    wherein the support structure comprises a first rail, a second rail, a third rail and a fourth rail, the first through fourth rails defining an exterior Periphery of the support structure, the first through fourth rails being integrally formed such that the support structure is unitary; and
    a first component attached to the support structure such that at least a portion of the support structure is located between the first component and the circuit assembly, the first component electrically communicating with the circuit assembly;
    wherein the component is a mezzanine board positioned substantially parallel to the circuit assembly;
    wherein at least one of the rails includes a recess; and
    wherein at least a portion of the mezzanine board is seated within the recess.

2. The system of claim 4, wherein the support structure comprises a first flange extending outwardly from a first one of the rails, the first one of the rails having a first length, the flange extending substantially along the first length of the first one of the rails.

3. The system of claim 1, further comprising: a second component electrically communicating with the circuit assembly.

4. The system of claim 3, wherein the second component is directly attached to the circuit assembly.

5. The system of claim 3, wherein the second component is attached to the support structure.

6. A system for mounting a component to a circuit assembly comprising:
    a support structure having rails defining an exterior periphery of the support structure, the rails being integrally formed such that the support structure is unitary, the support structure being sized and shaped to span at least one of the length and the width of the circuit assembly and being operative to increase the rigidity of a circuit assembly to which the support structure is attached;
    wherein the support structure comprises a first flange extending outwardly from a first one of the rails, the first one of the rails having a first length, the flange extending substantially along the first length of the first one of the rails;
    wherein the first flange has a downwardly extending first surface, a bottom extending from the surface generally parallel to the rails, and a second surface extending from the bottom and inclined with respect to the bottom.

7. The system of claim 6, further comprising:
    means for attaching the support structure to a circuit assembly.

8. The system of claim 6, wherein the support structure has a top surface and a bottom surface; and
    the rail has an exterior surface spanning between the top surface and the bottom surface, the exterior surface being inwardly inclined for guiding placement of a component.

9. The system of claim 6, further comprising:
    at least one beam extending between a first and a second of the rails.

10. A method for mounting a component to a circuit assembly comprising:
    providing a circuit assembly;
    providing a support structure of unitary construction;
    wherein the support structure has rails and beams defining a zone within which a component is to be placed; and
    attaching the support structure to the circuit assembly such that the support structure substantially spans at least one of the length and width of the circuit assembly;
    providing a component;
    using a surface of at least one of the beams and rails to align the component with the zone of the circuit assembly; and
    attaching the component to the support structure such that the component electrically communicates with the circuit assembly.

11. The method of claim 10, further comprising:
    dissipating heat produced by the component with the support structure.

12. The method of claim 11, further comprising:
    attaching the component to the circuit assembly such that the component contacts the support structure.

13. The method of claim 10, further comprising:
    wherein the component is a first component mounted to the circuit assembly using a first mounting technique; and
    further comprising:
        mounting a second component to the circuit assembly using a second mounting technique, the first mounting technique being different than the second mounting technique.

14. The method of claim 13, wherein the second component is attached to the support structure such that the second component electrically communicates with the circuit assembly.

* * * * *